United States Patent
Toutant

(10) Patent No.: US 6,628,212 B1
(45) Date of Patent: Sep. 30, 2003

(54) STATE-DRIVEN OVER-SAMPLING MANCHESTER DECODER

(75) Inventor: Roger Toutant, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 339 days.

(21) Appl. No.: 09/716,461

(22) Filed: Nov. 21, 2000

(51) Int. Cl.[7] ................................................ H03M 7/12
(52) U.S. Cl. ........................ 341/70; 341/68; 341/94; 341/80; 341/102; 375/333; 375/360; 375/361; 375/376
(58) Field of Search ........................ 341/70, 68, 80, 341/94, 50–107; 375/361, 376, 333, 360

(56) References Cited

U.S. PATENT DOCUMENTS

| | | | |
|---|---|---|---|
| 3,979,746 A | 9/1976 | Jarrett | 340/347 |
| 4,292,626 A | 9/1981 | Smithlin | 340/347 |
| 4,361,895 A | 11/1982 | Khoudari | 375/87 |
| 4,525,848 A | 7/1985 | Simpson | 375/87 |
| 4,542,420 A | 9/1985 | Kozlik et al. | 360/42 |
| 4,584,695 A * | 4/1986 | Wong et al. | 375/327 |
| 5,023,891 A | 6/1991 | Johnson, III | 375/87 |
| 5,491,713 A * | 2/1996 | Kwok et al. | 375/333 |
| 5,491,729 A * | 2/1996 | Co et al. | 375/376 |
| 5,761,255 A * | 6/1998 | Shi | 375/360 |
| 5,790,610 A * | 8/1998 | Julyan | 375/361 |
| 6,008,746 A * | 12/1999 | White | 341/70 |

* cited by examiner

Primary Examiner—Michael Tokar
Assistant Examiner—Linh V Nguyen
(74) Attorney, Agent, or Firm—Ridout & Maybee LLP

(57) ABSTRACT

A method and apparatus for a state-driven decoder for decoding a Manchester encoded signal. The decoder comprises an input sampling stage, an over-sampling clock, and a digital logic state machine. The over-sampling clock operates at a frequency which is less than five times the data rate of the encoded signal. The input sampling stage asynchronously samples the encoded signal at the frequency of the over-sampling clock and a produces a stream of pulse samples. The digital logic state machine analyzes the stream of pulse samples in groups and based on the logic levels of each group of pulse samples generates an output bit corresponding to the decoded Manchester signal.

14 Claims, 1 Drawing Sheet

STATE-DRIVEN OVER-SAMPLING MANCHESTER DECODER

FIELD OF THE INVENTION

The present invention relates to digital signal processing systems, and more particularly to a method and apparatus for state-driven over-sampling in a Manchester decoder.

BACKGROUND OF THE INVENTION

The Manchester protocol is a well-known encoding/decoding protocol for digital signals. It is often utilized in communication systems where a minimum transition density is required, or where a DC-balanced signal is required, for example, in AC-coupled communication links. The digital signal is encoded according to the Manchester protocol and decoded using a Manchester decoder.

The Manchester encoded signal comprises a self-clocking code with a minimum of one and a maximum of two level transitions per bit. A zero (i.e. logic LOW) is encoded as a Low-to-High transition, and a one (i.e. logic HIGH) is encoded as a High-to-Low transition. Between two identical bits of data in an encoded signal, there is an extra level transition which must be ignored by the decoder. As a result, the decoder needs some information about the bit timing. Conventional decoders typically utilize a clock with timing (i.e. frequency) that is a known multiple of the encoding clock for the Manchester signal.

To decode the received (i.e. encoded) digital signal, known Manchester decoder designs utilize two general approaches. One approach involves asynchronously over-sampling the encoded signal at a rate greater than 5 times the frequency of the signal. The other approach involves recovering a synchronous clock signal from the encoded digital signal and using the recovered clock to decode (i.e. read) the data in the received signal. To accurately recover the synchronous clock signal, a Phase Locked Loop or PLL clock recovery system is typically used in the decoder design, which as will be appreciated adds to the cost of the decoder.

It will be appreciated that both approaches, i.e. high over-sampling ratios or synchronous clock recovery, increase the complexity and cost of the Manchester decoder design. In addition, the frequencies involved with high over-sampling ratios tend to limit the design options for silicon implementations. For example, conventional Field Programmable Gate Array (FPGA) devices may not be suitable for such applications.

Accordingly, there remains a need for a decoder design suitable for Manchester encoded signals which overcomes the shortcomings of existing designs.

BRIEF SUMMARY OF THE INVENTION

The present invention provides a method and apparatus for a Manchester decoder. According to one aspect of the invention, a low over-sampling ratio is utilized which makes the decoder suitable for implementation in a semi-custom silicon device, such as Field Programmable Gate Array (FPGA). The Manchester decoder design according to the present invention does not require generating a synchronous decoder clock, i.e. a clock which is synchronous with the received data signal. Accordingly, the need for a Phase Locked Loop (PLL) device is also eliminated.

In a first aspect, the present invention provides a decoder for decoding a signal encoded according to a Manchester protocol, the decoder comprises: (a) a sampling clock, and the sampling clock operates asynchronously with the encoded signal; (b) a sampling stage having an input port for receiving the encoded signal, and the sampling stage samples the encoded signal on a periodic basis in response to clock pulses from the sampling clock, and the sampling stage generates a stream of output pulses corresponding to logic states in the encoded signal; (c) a decoder stage having an input for receiving the stream of output pulses and includes a logic state machine, the logic state machine takes a group of sequential samples from the output pulse stream and determines an output logic state for the encoded signal, the output logic state is based on the sequence of logic levels in the group of sequential samples.

In another aspect, the present invention provides a method for decoding a signal encoded according to a Manchester protocol and having a known data rate, the method comprises the steps of: (a) sampling the encoded signal to generate a stream of pulse samples having logic levels based on logic states in the encoded signal, and the sampling is performed on the basis of a sample clocking signal, and the sample clocking signal runs asynchronously to the encoded signal; (b) taking a group of sequential pulse samples; (c) determining an output logic state for the encoded signal based on the logic levels of the sequential pulse samples in the group.

In a further aspect, the present invention provides a decoder implemented as an integrated circuit for decoding a signal encoded according to a Manchester protocol and having a known data rate, the decoder comprises: (a) a sampling clock which operates asynchronously with the encoded signal; (b) a sampling stage having an input port for receiving the encoded signal, and the input sampling stage samples the encoded signal on a periodic basis in response to clock pulses from the sampling clock, and the input sampling stage generates a stream of pulse samples corresponding to logic states in the encoded signal: (c) a decoder stage having an input for receiving the stream of pulse samples and including a logic state machine, the logic state machine takes a group of sequential pulse samples and determines an output logic state for the encoded signal, and the output logic state is based on the sequence of logic levels in the group of pulse samples.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Reference will now be made to the accompanying drawings, which show, by way of example, a preferred embodiment of the present invention, and in which.

DETAILED DESCRIPTION OF THE PREFERRED EMBODIMENT

Figure 1:
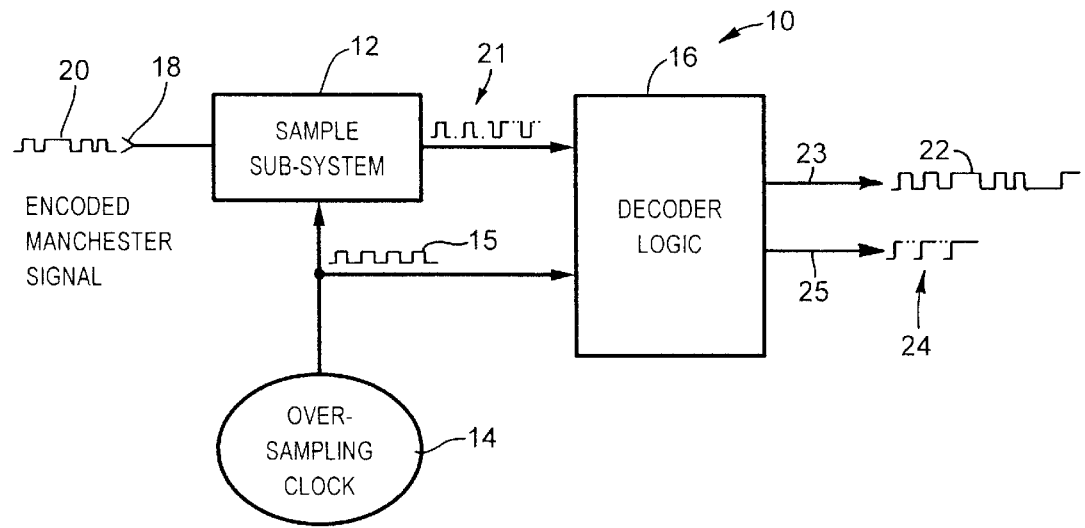
FIG. 1 shows in block diagram form an arrangement of a Manchester decoder in accordance with the present invention.

Reference is first made to FIG. 1, which shows in diagrammatic form a Manchester decoder according to the present invention and indicated generally by reference 10. As shown, the decoder 10 comprises a sample input subsystem 12, an over-sampling clock 14, and a decoder logic module 16. The sample input sub-system 12 includes an input port 18 for receiving a Manchester encoded signal with the signal being denoted by reference 20. As will be described, the Manchester encoded receive signal 20 is sampled by the input sample sub-system 12 in time with the over-sampling clock 14. The input sample sub-system 12 outputs samples (e.g. pulses 21) of the Manchester encoded receive signal 20 to the decoder logic module 16. The samples 21 output by the input sample sub-system 12 comprise a sequence of logic HIGH and logic LOW samples. The decoder logic module 16 implements a state machine for decoding the samples 21 of the Manchester encoded receive signal 20 into a decoded Manchester output signal 22 as will be described in more detail below. The decoder logic module 16 also includes logic circuitry for generating a data valid output signal 24 in conjunction the decoded output signal 22.

The Manchester encoded signal 20 is the output of a standard Manchester encoder system (not shown) and is received at the input port 18 of the input sample sub-system 12. The encoded signal 20 comprises a stream of binary bits, HIGH and LOW, that are generated at a specific bit rate, for example, 15 Mbits/sec, by the Manchester encoder system (not shown). The bit rate of 15 Mbits/sec yields a 'bit-period' of approximately 67 nanoseconds (ns).

Manchester encoder systems may be described as utilizing either a "Case H" encoding protocol or convention or a "Case L" encoding protocol or convention. For the Case H protocol, a HIGH bit is represented by a low-going edge in the middle of the encoded bit (i.e. mid-point of the bit-period); and a LOW bit is represented by a high-going edge in the middle of the bit-period for the encoded bit. For the Case L protocol, a HIGH bit is represented by a high-going edge in the middle of the encoded bit (i.e. the mid-point of the bit-period); and a LOW bit is represented by a low-going edge in the middle of the bit-period for the encoded bit.

Referring back to FIG. 1, the over-sampling clock 14 generates a clock signal 15 which is used by the input sample sub-system 12 to sample the Manchester encoded receive signal 20 and produce the output samples 21. The over-sampling clock 14 also drives the decoder logic module 16 as indicated in FIG. 1. According to this aspect, the clock signal generated by the over-sampling clock 14 runs asynchronously to the Manchester encoded receive signal 20, i.e. there is no specific phase or frequency relationship imposed on the clock signal from the over-sampling clock 14 in relation to the Manchester encoded receive signal 20.

Also according to this aspect, the frequency of the over-sampling clock 14 is operated at lower frequency than in conventional decoder systems. In the context of the present invention, the over-sampling ratio or "V" is defined as the ratio between the over-sampling clock rate and the data rate of the encoded signal 20, where the over-sampling ratio V may comprise a non-integer or floating point number. For example, if the data rate for the Manchester encoded signal 20 is 15 Mbit/sec, and the over-sampling clock 14 has a frequency of 50 MHz, the over-sampling ratio V is equal to 3.33.

The input sample sub-system 12 provides the decoder logic module 16 with one sample 21 of the Manchester encoded receive signal 20 per one cycle of the over-sampling clock 14. For example, if the over-sampling clock 14 runs at a frequency of 50 MHz., then the input sample sub-system 12 provides the decoder logic module 16 with 50 million samples 21 of the Manchester encoded receive signal 20 each second.

The decoder logic module 16 comprises logic circuitry which decodes the incoming samples 21 from the input sample sub-system 12 and converts the samples 21 into a decoded output signal 22 on output port 23. In the preferred embodied, the decoded output signal 22 comprises a binary bit (i.e. HIGH or LOW) corresponding to each decoded binary bit in the Manchester encoded receive signal 20. The decoder logic module 16 also generates a data valid signal 24 on output 25. The data valid signal 24 (e.g. low-to-high binary transition) indicates that a valid data bit is present on the output 23 for the decoded Manchester output signal 22.

As will now be described, the decoder logic module 16 implements a process that decodes the Manchester encoded receive signal 20 by analyzing the polarity and sequence of the samples 21 generated by the input sample sub-system 12.

Figure 2:
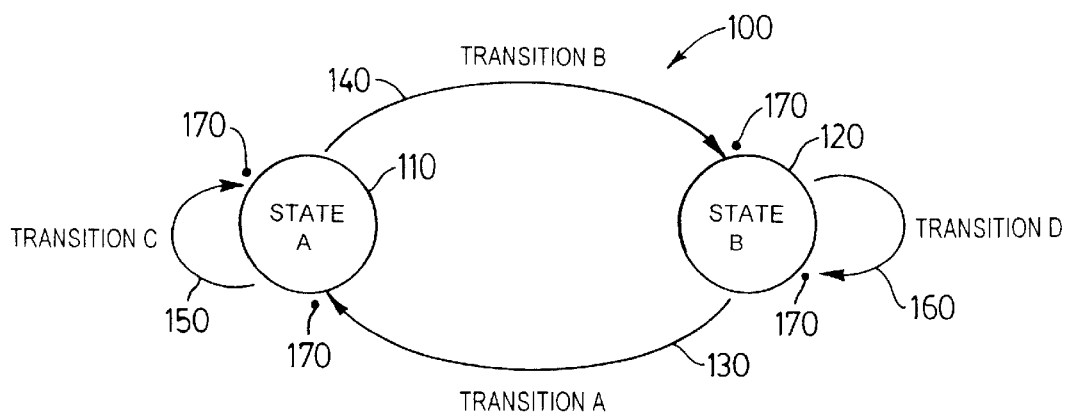
FIG. 2 depicts in state diagram form a method for over-sampling a Manchester decoder according to the present invention.

Reference is made to FIG. 2, which shows a process for decoding the Manchester encoded receive signal 20. The process is indicated generally by reference 100 and is represented in the form of a state diagram or state machine. In the decoding process 100, State A indicated by reference 1 10 in FIG. 2, represents a HIGH bit for Case H type Manchester encoding: for Case L Manchester encoding, State A (110) represents a LOW bit. State B, indicated by reference 120 in FIG. 2, represents a LOW bit for Case H Manchester encoding, or a HIGH bit for Case L Manchester encoding.

Referring still to FIG. 2, Transition A, indicated by reference 130, corresponds to the existence of predetermined number N, or greater, of consecutive HIGH data samples 21 from the input sample sub-system 12. Transition B, indicated by reference 140, corresponds to the existence of N, or greater, consecutive LOW data samples 21 from the input sample sub-system 12. Transition C, indicated by reference 150, corresponds to the existence of a predetermined number M, or fewer, consecutive LOW data samples 21, that are followed by M, or fewer, consecutive HIGH data samples 21. Transition D. indicated by reference 160, corresponds to the existence of M, or fewer, consecutive HIGH data samples 21, which are followed by M, or fewer, consecutive LOW data samples 21.

It will be appreciated that the 'state' of the decoder logic module 16 is equal to the logic level of the bit being output for the decoded Manchester signal 22. For example, if the decoder logic module 16 is decoding according to Case H, then the output for the decoded Manchester signal 22 is HIGH when the decoder 16 is in State A, and for State B, the output for the decoded Manchester signal 22 will be LOW.

Each time one of the transitions 130, 140, 150 or 160 is completed, the decoder logic module 16 asserts the data valid signal 24. The data valid signal 24 indicates that a valid data bit has been decoded in the Manchester signal and the data bit, i.e. the decoded Manchester signal, 22 is available for processing by subsequent logic stages (not shown). In the state diagram depicted in FIG. 2, assertions of the data valid signal 24 are indicated by solid circles denoted by reference 170.

In the preferred embodiment, the over-sampling ratio or V is selected as 3.33. It has been found that a value of 3.33 for the over-sampling ratio V simplifies the design of the decoder 16, in particular the input sampling sub-system 12, by optimizing the set-up and hold times required for its internal logic devices, typically flip-flops. An over-sampling ratio V in this range lends the decoder logic module 16, and the decoder 10, suitable for implementation in a FPGA (Field Programmable Gate Array), such as the line of FPGAs devices available from the Xilinx Corporation. The variable N is chosen such that N is equal to the over-sampling ratio V 'rounded-down' to the nearest integer. For V=3.33, the variable N is 3. The variable M is equal to N−1 or N−2.

According to the preferred embodiment, the decoder logic module 16 is implemented as a digital logic state machine which advances on each cycle of the over-sampling clock 14. The state of the decoder logic module 16 (i.e. the digital logic state machine) is based on the polarity and sequence of the data samples 21 generated by the input sample subsystem 12 for the incoming Manchester encoded receive signal 20 (FIG. 1) as described above with reference to the state diagram 100 in FIG. 2.

The operation of the decoder logic module 16 and its digital logic state machine is described with reference to an example as shown in Table I below, For this example, it is assumed that the encoded Manchester receive signal 20 was encoded according to the Case H convention as described above.

TABLE I

| Sample No. | Sample Value (21 - FIG. 1) | Decoder State | Decoded Manchester Signal Output (22 - FIG. 1) | Data Valid Signal (24 - FIG. 1) |
|---|---|---|---|---|
| 1 | LOW | A | HIGH | |
| 2 | LOW | A | HIGH | |
| 3 | LOW | B | LOW | Assert |
| 4 | HIGH | B | LOW | |
| 5 | LOW | B | LOW | |
| 6 | LOW | B | LOW | Assert |
| 7 | HIGH | B | LOW | |
| 8 | HIGH | B | LOW | |
| 9 | HIGH | A | HIGH | Assert |

The decoder 16 is assumed to initially be in State A (110—FIG. 2), and the Manchester encoded receive signal 20 is decoded according to the Case H convention.

With N=3 and M=2, two or three samples 21 are required to make a determination. Referring to Table I above, for sample nos. 1 to 3, there are three consecutive LOW samples 21 (i.e. N=3), and therefore the state machine 100 moves from State A (110—FIG. 2) to State B (120) based on Transition B (140). This results in a LOW value for the decoded signal output 22. For sample nos. 4 to 6, there is one HIGH sample 21 (i.e. M=1) and two LOW samples 31 (i.e. M=2). This corresponds to Transition D (160—FIG. 2), and the state machine 100 remains in State B and a LOW value for the decoded signal output 22 is asserted. For sample nos. 7 to 9, there are three consecutive HIGH samples 21 (i.e. N=3). This corresponds to Transition A (130—FIG. 2). The state machine 100 moves from State B (120) to State A (110), and a HIGH value for the decoded signal output 22 is asserted. As described above, the data valid signal 24 is also asserted with each output for the decoded signal 22.

The present invention may be embodied in other specific forms without departing from the spirit or essential characteristics thereof. Certain adaptations and modifications of the invention will be obvious to those skilled in the art. Therefore, the presently discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. A decoder for decoding a signal encoded according to a Manchester protocol and having a known data rate, said decoder comprising:

(a) a sampling clock, and said sampling clock operating asynchronously with the encoded signal, (b) a sampling stage having an input port for receiving the encoded signal, said input sampling stage sampling the encoded signal on a periodic basis in response to clock pulses from said sampling clock, and said input sampling stage generating a stream of pulse samples corresponding to logic states in the encoded signal;

(c) a decoder stage having an input for receiving said stream of pulse samples and including a logic state machine, said logic state machine taking a group of sequential pulse samples and determining an output logic state for the encoded signal, said output logic state being based on the sequence of logic levels in said group of pulse samples.

2. The decoder as claimed in claim 1, wherein said sampling clock operates at a frequency less than five times the data rate of the encoded signal.

3. The decoder as claimed in claim 1, wherein said logic state machine comprises a first state corresponding to a HIGH output logic state and a second state corresponding to a LOW output logic state, and said logic state machine including a first transition for moving from said second state to said first state, a second transition for moving from said first state to said second state, and said first transition being responsive to a group of sequential pulse samples having a predetermined number of HIGH logic level pulses, and said second transition being responsive to a group of sequential pulse samples having a predetermined number of LOW logic level pulses.

4. The decoder as claimed in claim 3, wherein said logic state machine includes a third transition for remaining at said first state, and a fourth transition for remaining at said second state, and said third transition being responsive to a group of sequential pulse samples having a second predetermined number of LOW logic level pulses and the same or fewer number of HIGH logic level pulses, and said fourth transition being responsive to a group of sequential pulse samples having a second predetermined number of HIGH logic level pulses and the same or fewer number of LOW logic level pulses.

5. The decoder as claimed in claim 4, having an over-sampling ratio defined as the ratio between the frequency of the sampling clock and the data rate of encoded signal, wherein said over-sampling ratio is less than or equal to five.

6. The decoder as claimed in claim 5, wherein said first predetermined number is defined as the over-sampling ratio rounded down to a nearest integer and said second predetermined number is defined as said first predetermined number minus one.

7. In a decoder, a method for decoding a signal encoded according to a Manchester protocol and having a known data rate, said method comprising the steps of:

(a) sampling the encoded signal to generate a stream of pulse samples having logic levels based on logic states in the encoded signal, wherein said sampling is performed on the basis of a sample clocking signal, and said sample clocking signal running asynchronously to the encoded signal;

(b) taking a group of sequential pulse samples; and (c) determining an output logic state for the encoded signal based on the logic levels of the sequential pulse samples in said group.

8. The method as claimed in claim 7, wherein said sampling clock signal has a frequency less than five times the data rate of the encoded signal.

9. The method as claimed in claim 7, wherein said output logic state comprises a logic HIGH value or a logic LOW value, and said step of determining an output logic state comprises changing the output logic state to the logic HIGH value from the logic LOW value if the group of sequential pulse samples include a predetermined number of HIGH logic levels, and changing the output logic state to the logic LOW value from the logic HIGH value if the group of sequential pulse samples include a predetermined number of LOW logic levels.

10. The method as claimed in claim 9, wherein said step of determining an output logic state further includes the step of maintaining the output logic state at the logic HIGH value if the group comprises a sequence of pulse samples having a second predetermined number of LOW logic levels, and the same or fewer number of HIGH logic levels, and further includes the step of maintaining the output logic state at the logic LOW value if the group comprises a sequence of pulse samples having a second predetermined number of HIGH logic levels, and the same or fewer number of LOW logic levels.

11. A decoder implemented as an integrated circuit for decoding a signal encoded according to a Manchester protocol and having a known data rate, said decoder comprising:

(a) a sampling clock, and said sampling clock operating asynchronously with the encoded signal;

(b) a sampling stage having an input port for receiving the encoded signal, said input sampling stage sampling the encoded signal on a periodic basis in response to clock pulses from said sampling clock, and said input sampling stage generating a stream of pulse samples corresponding to logic states in the encoded signal;

(c) a decoder stage having an input for receiving said stream of pulse samples and including a logic state machine, said logic state machine taking a group of sequential pulse samples and determining an output logic state for the encoded signal, said output logic state being based on the sequence of logic levels in said group of pulse samples.

12. The decoder implemented as an integrated circuit as claimed in claim 11, wherein said sampling clock operates at a frequency less than five times the data rate of the encoded signal.

13. The decoder implemented as an integrated circuit as claimed in claim 12, wherein said logic state machine comprises a first state corresponding to a HIGH output logic state and a second state corresponding to a LOW output logic state, and said logic state machine including a first transition for moving from said second state to said first state, a second transition for moving from said first state to said second state, and said first transition being responsive to a group of sequential pulse samples having a predetermined number of HIGH logic level pulses, and said second transition being responsive to a group of sequential pulse samples having a predetermined number of LOW logic level pulses.

14. The decoder implemented as an integrated circuit as claimed in claim 13, wherein said logic state machine includes a third transition for remaining at said first state, and a fourth transition for remaining at said second state, and said third transition being responsive to a group of sequential pulse samples having a second predetermined number of LOW logic level pulses and the same or fewer number of HIGH logic level pulses, and said fourth transition being responsive to a group of sequential pulse samples having a second predetermined number of HIGH logic level pulses and the same or fewer number of LOW logic level pulses.

* * * * *